United States Patent
Suzuki

(10) Patent No.: US 7,322,678 B2
(45) Date of Patent: Jan. 29, 2008

(54) FLEXIBLE WIRING CABLE FOR RECORDING APPARATUS

(75) Inventor: Shigeru Suzuki, Nagoya (JP)

(73) Assignee: Brother Kogyo Kabushiki Kaisha, Nagoya-shi (JP)

( * ) Notice: Subject to any disclaimer, the term of this patent is extended or adjusted under 35 U.S.C. 154(b) by 451 days.

(21) Appl. No.: 11/050,891

(22) Filed: Feb. 4, 2005

(65) Prior Publication Data

US 2005/0174368 A1   Aug. 11, 2005

(30) Foreign Application Priority Data

Feb. 5, 2004   (JP)   .............................. 2004-029321

(51) Int. Cl.
*B41J 2/14*   (2006.01)
*B41J 2/05*   (2006.01)

(52) U.S. Cl. .......................................... 347/50; 347/58

(58) Field of Classification Search ................. 347/50, 347/58

See application file for complete search history.

(56) References Cited

U.S. PATENT DOCUMENTS

| | | | | |
|---|---|---|---|---|
| 4,950,527 A | * | 8/1990 | Yamada | ...................... 428/192 |
| 5,283,947 A | * | 2/1994 | Santo et al. | ................... 29/840 |
| 6,206,507 B1 | | 3/2001 | Hino | |
| 6,679,595 B2 | | 1/2004 | Yamada et al. | |
| 7,040,737 B2 | * | 5/2006 | Takata et al. | ................. 347/50 |

FOREIGN PATENT DOCUMENTS

| | | |
|---|---|---|
| JP | 11-165408 | 6/1999 |
| JP | A-2002-240306 | 8/2002 |

* cited by examiner

*Primary Examiner*—Stephen Meier
*Assistant Examiner*—Rene Garcia, Jr.
(74) *Attorney, Agent, or Firm*—Reed Smith LLP

(57) ABSTRACT

A flexible wiring cable 60 connects a recording head 7 and a relay board, and includes COF (chip on film) 62 for connecting an output side wiring pattern of an IC chip 61 to the recording head 7, and general purpose FFC (flexible flat cable) 63 formed with a parallel wiring pattern. The flexible wiring cable 60 connects the output side wiring pattern of the IC chip 61 to the relay board 50 via FFC 63, thereby decreasing the use of more expensive COF 62 by the use of cheap, general purpose FFC 63. Thus, the product cost as the entire recording apparatus is reduced by using the general purpose flexible board for a part of a flexible board having a driving circuit mounted thereon and serving as a connecting means for connecting a recording means and a relay board, suppressing the manufacturing cost of parts for connecting means.

20 Claims, 9 Drawing Sheets

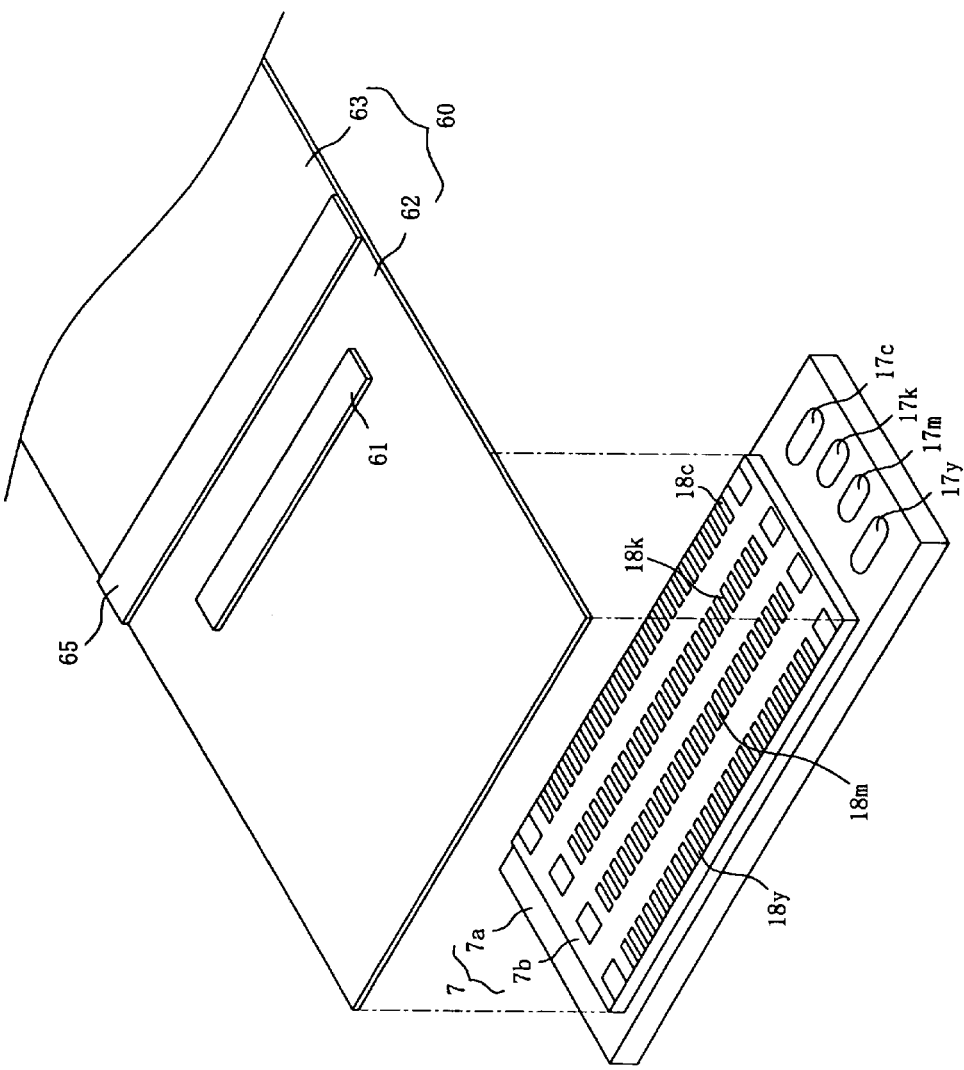

FLEXIBLE WIRING CABLE FOR RECORDING APPARATUS

BACKGROUND OF THE INVENTION

1. Field of the Invention

The present invention relates to a recording apparatus. In particular, the present invention relates to a recording apparatus in which a general purpose flexible board is used for a part of a flexible board on which a driving circuit is mounted and which serves as a connecting means for connecting a recording means and a relay board so that the part cost of the connecting means can be suppressed.

2. Description of the Related Art

Conventionally, the printer (recording apparatus) for recording an image on a recording medium, for example, the ink-jet printer has been constructed as follows in order to avoid the pollution with any excessive ink such as the ink mist which is produced when the ink is jetted from nozzles. That is, the driving circuit board for the recording head is arranged at a position separated far from the nozzles of the recording head. The recording head and the driving circuit board have been electrically connected to one another by the aid of the flexible board (U.S. Pat. No. 6,206,507 B1 (corresponding to Japanese Patent Application Laid-open No. 11-165408), for example, FIG. 2).

In recent years, it is contemplated to simplify the structure of the head unit by constructing the head unit by using so-called TAB (tape automated bonding) and/or COF (chip on film) which includes an IC chip mounted as a driving circuit on a flexible board to be connected to the recording head. In the case of COF or the like, the input side wiring of the IC chip is connected to a relay board which is carried on the head unit. The recording data, which is outputted from the control circuit, is inputted into the IC chip via the relay board.

However, in recent years, it is more strictly required that the printing is performed at a high speed with high definition. Therefore, as for the recording head, the number of nozzles is increased, while the nozzle pitch is decreased. Accordingly, the terminal pitch of the recording head and the bump pitch of the IC chip are narrowed. As a result, the wiring density of COF or the like is narrowed, and the processing cost becomes expensive. For theses causes, a problem has arisen such that the product cost becomes more expensive for COF or the like which is originally an expensive part.

On the other hand, the relay board is arranged at the position separated far from the recording head in order to avoid the pollution with the ink. Therefore, the wiring length of COF or the like (product length) is lengthened to connect the relay board and the recording head. Corresponding thereto, a problem has arisen such that the product cost becomes extremely expensive. The product cost of COF or the like is proportional to the entire length thereof. Therefore, even when the length is extended for the input side wiring portion of the IC chip in which the wiring density is more widened, the product cost is equivalent to that of the case in which the output side wiring portion, in which the wiring density is more narrowed, is extended.

SUMMARY OF THE INVENTION

The present invention has been made in order to solve the problems as described above, an object of which is to provide, at a low price, a recording apparatus based on the use of a flexible board or cable on which a driving circuit is mounted and which connects a recording head and a relay board to one another.

According to a first aspect of the present invention, there is provided a recording apparatus comprising a recording means which performs recording on a recording medium; a driving circuit which drives the recording means; a control means which controls the recording apparatus; a relay board which relays recording data outputted from the control means to the driving circuit; and a connecting means which electrically connects the recording means, the driving circuit, and the relay board; wherein the connecting means includes a first flexible board on which the driving circuit is mounted and which is formed with output side wirings of the driving circuit to be connected to the recording means and input side wirings of the driving circuit; and a second flexible board which is formed with a pattern of wirings which are parallel to one another having one end to be connected to the input side wirings of the first flexible board and the other end to be connected to the relay board on a side opposite to the one end.

According to the recording apparatus of the present invention, the first flexible board, on which the driving circuit is mounted, is constructed such that the output side wiring of the driving circuit is connected to the recording means, while the input side wiring of the driving circuit is connected to the relay board via the second flexible board in which the parallel wiring pattern is formed. That is, it is possible to decrease the use of the more expensive first flexible board by the use of the second flexible board, on condition that the second flexible board, in which the parallel wiring pattern is formed, is constructed more cheaply as compared with the first flexible board on which the driving circuit is mounted and in which the exclusive wiring pattern corresponding to the recording means is formed. Corresponding thereto, it is possible to reduce the product cost as the entire recording apparatus.

In the recording apparatus of the present invention, the second flexible board may have a reinforcing plate which is added to the other end to be connected to the relay board, and the other end may be detachably connected to a connector device provided for the relay board. Accordingly, as for the second flexible board, the reinforcing plate is added at the other end of the wiring to be connected to the relay board, and the other end is connected to the connector device provided for the relay board. Therefore, the second flexible board, which is composed of the parallel wiring pattern, can be detachably connected to the connector of the relay board with ease. When the recording means, the driving circuit, and/or the relay board is required to be exchanged due to any initial failure or any trouble, the attachment/detachment operation can be easily performed. Further, it is unnecessary to install any special connector with respect to the second flexible board. Therefore, it is possible to reduce the cost.

In the recording apparatus of the present invention, the input side wirings of the first flexible board and the wirings of the second flexible board may be formed symmetrically with respect to a center in an arrangement direction of the wirings of the first and second flexible boards at connecting side ends thereof; a connecting side end of the input side wirings of the first flexible board to be connected to the second flexible board may be exposed in a surface direction of the first flexible board; a connecting side end of the wirings of the second flexible board to be connected to the first flexible board may be exposed in a surface direction on both front and back surfaces of the second flexible board; and the exposed connecting side end of the input side wirings and the exposed connecting side end of the wirings may be overlapped and connected to one another. Accordingly, even when any one of the front and back exposed surfaces of the wiring of the second flexible board is directed to the exposed surface of the wiring of the first flexible board, the exposed ends of the both flexible boards can be overlapped and connected to one another. In particular, when the reinforcing plate is added at the other end of the wiring of the second flexible board on the side of the relay board, the second flexible board can be commonly used even in the case of those in which the contact of the connector on the relay board is provided on any one of the upper and lower sides with respect to the reinforcing plate. As a result, it is possible to reduce the product cost as the entire recording apparatus. The connecting side ends of the first flexible board and the second flexible board are connected by overlapping the exposed ends of the respective wirings. Therefore, for example, when the connecting portions are connected by the soldering, even if any short circuit is formed between the adjoining terminals or even if any open terminal is formed, then the respective flexible boards can be reused by releasing them from the connected state by melting the solder at the connecting portions again. Therefore, it is possible to improve the yield when the recording apparatus is produced.

In the recording apparatus of the present invention, the relay board may be arranged by a spacing distance to the plurality of recording elements or means, and the second flexible board may be connected to a surface of the relay board disposed on a side opposite to a side of the recording element or means. Therefore, the connecting portion between the relay board and the second flexible board can be prevented beforehand from being polluted with any excessive ink such as the ink mist. Further, the operation space can be secured over the connecting portion between the relay board and the second flexible board, and it is possible to improve the operation efficiency, for example, for the connecting operation and the repairing operation when any trouble occurs.

In the recording apparatus of the present invention, the recording means may be an ink-jet head comprising a plurality of nozzles which discharge an ink, and pressure-generating means which selectively applies discharge pressures to the ink contained in each of the nozzles and further comprising an ink tank which supplies the ink to each of the nozzles; the ink tank may be arranged over the pressure-generating means disposed on a side opposite to an ink discharge side, and the relay board may be arranged over the ink tank; and the second flexible board and the relay board may be connected to each other on a side of an upper surface of the relay board as a surface disposed on the side opposite to the ink tank. Therefore, the connecting portion between the relay board and the second flexible board can be prevented beforehand from being polluted with any excessive ink such as the ink mist. Further, the operation space can be secured over the connecting portion between the relay board and the second flexible board, and it is possible to improve the operation efficiency, for example, for the connecting operation and the repairing operation when any trouble occurs.

In the recording apparatus of the present invention, the recording means may have two groups of nozzle arrays, and the first flexible board on which the driving circuit is mounted and the second flexible board which is connected to the first flexible board may be provided for each of the groups; the second flexible boards of the respective groups may be connected to two connector devices provided along both opposing side edges of the relay board respectively; one of the two connector devices may be constructed to be retainable of a tip of the wirings of the other end side of the second flexible board in a state of being electrically connected to the wirings of the second flexible board, and to be detachably insertable of the tip of the wirings of the other end side; and the other of the two connector devices may be constructed such that a lever member which is swingably operated is provided, a receiving section is opened or released when the lever member is swingably operated in one direction, and a tip of the wirings of the other end side, which has been received in the receiving section, is retainable in a state in which the tip of the wirings of the other end side is electrically connected when the lever member is swingably operated in a different direction from the one direction. In accordance with this structure, the one connector device of the relay board is firstly approached the end of one of the second flexible boards to effect the connection between the both, and then the other connector device of the relay board is approached the end of the other second flexible board to effect the connection by the lever member. Accordingly, even when the first and second flexible boards have the minimum lengths to connect the two groups of the recording means and the both sides of the relay board, the connecting operation can be performed with ease. Therefore, the amount of looseness, which is previously provided for the connecting operation, can be minimized between the recording means and the relay board for the first and second flexible boards. The part, which is composed of the recording means and the relay board, can be miniaturized.

In the recording apparatus of the present invention, the first flexible board may have a length which is designed to be shorter than a length of the second flexible board. That is, the entire length, which is required for the both of the first and second flexible boards as a whole, is secured by relatively increasing the ratio of use of the second flexible board. Corresponding thereto, it is possible to decrease the use of the first flexible board which is more expensive. Therefore, it is possible to reduce the product cost as the entire recording apparatus.

According to a second aspect of the present invention, there is provided a recording apparatus comprising a plurality of recording means which perform recording on a recording medium, a control means which controls the recording apparatus, a relay board which relays recording data outputted from the control means to the recording means, and a plurality of connecting means which electrically connect the recording means to the relay board; wherein each of the connecting means includes a first flexible board which is formed with a pattern of wirings having an output side end corresponding to an associated recording means of the plurality of recording means to be connected thereto and an input side end; and a second flexible board which is formed with a pattern of wirings which are parallel to one another having one end to be connected to the input side end of the first flexible board and the other end to be connected to the relay board on a side thereof opposite to the one end; and wherein the input side end of the first flexible board and the one end of the second flexible board connected thereto are formed symmetrically with respect to a center in an arrangement direction of the input side end and the one end, the input side end of the first flexible board is exposed in a surface direction of the first flexible board, the one end of the second flexible board to be connected to the first flexible board is exposed in a surface direction on both front and back surfaces of the second flexible board, and the exposed input side end and the exposed one end are overlapped and connected to each other; the second flexible board has a reinforcing plate which is added to one surface of the other end to be connected to the relay board; and the relay board has a plurality of connectors which are provided along side edges opposing to each other, a connector of the connectors, which is provided along one of the side edges, is constructed so that the other end of the second flexible board to be connected to the relay board is detachably insertable, a connector of the connectors, which is provided along the other of the side edges, is constructed so that the other end of the second flexible board to be connected to the relay board is retainable with a swingable lever member, and the connector provided along the one of the side edges and the connector provided along the other of the side edges have contacts to make contact with the ends of the second flexible boards, the contacts being disposed on mutually opposite sides with respect to the surface of the flexible board.

According to the recording apparatus of the second aspect, the part, which is composed of the recording means and the relay board, can be miniaturized. Even when any one of the front and back exposed surfaces of the wiring of the second flexible board is directed to the exposed surface of the wiring of the first flexible board, the exposed ends of the both flexible boards can be overlapped and connected to one another. Therefore, the second flexible boards, which are manufactured approximately identically, can be used for a plurality of connecting portions for connecting the side edges of the relay board and the recording means of the respective groups. Further, the second flexible board, for which the general purpose parallel wiring pattern is sufficient, can be constructed more cheaply as compared with the first flexible board in which the exclusive wiring pattern corresponding to the recording means is formed. Therefore, the use of the first flexible board can be decreased by the use of the second flexible board. In addition thereto, it is possible to reduce the product cost as the entire recording apparatus. The connecting side ends of the first flexible board and the second flexible board are connected to each other by overlapping the exposed ends of the respective wirings with each other. Therefore, for example, when the connecting portion is connected by the soldering, the respective flexible boards can be reused by melting the solder of the connecting portion again, even if any short circuit is formed between the adjoining terminals or even if any open terminal appears. Therefore, when the recording apparatus is produced, it is possible to improve the yield.

In the recording apparatus as described above, a driving circuit, which drives the recording means, may be mounted on the first flexible board. When the driving circuit is mounted on the first flexible board, it is possible to simplify the system of the unit constructed by the recording means, the driving circuit, the relay board, and the connecting means.

In the recording apparatus of the present invention, the recording means may be an ink-jet head comprising a plurality of nozzles which discharge an ink, and pressure-generating means which selectively applies discharge pressures to the ink contained in each of the nozzles and further comprising an ink tank which supplies the ink to each of the nozzles; and the relay board may be arranged on a side opposite to the ink-jet head with the ink tank intervening therebetween. Therefore, the relay board or the connecting portion between the relay board and the second flexible board can be prevented beforehand from being polluted with any excessive ink such as the ink mist. Further, the operation space can be secured over the relay board (on the side opposite to the ink tank), and it is possible to improve the operation efficiency, for example, for the connecting operation with respect to the second flexible board and the repairing operation when any trouble occurs.

In the recording apparatus of the present invention, the driving circuit may convert recording data outputted in serial from the control means into a parallel signal corresponding to the plurality of recording means, the parallel signal being outputted as a voltage for driving the recording means. Accordingly, it is possible to decrease the number of wirings of the input side wiring formed in the first flexible board, and it is possible to simplify the structure of the second flexible board to be connected to the input side wiring. As a result, it is possible to reduce the product cost of the second flexible board.

According to a third aspect of the present invention, there is provided a recording apparatus comprising a recording head which performs recording on a recording medium; a driving circuit which drives the recording head; a control unit which controls the recording apparatus; a relay board which relays recording data outputted from the control unit to the driving circuit; and a connecting wiring which electrically connects the recording head, the driving circuit, and the relay board; wherein the connecting wiring includes a first flexible board on which the driving circuit is mounted and which is formed with output side wirings of the driving circuit to be connected to the recording head and input side wirings of the driving circuit; and a second flexible board which is formed with a pattern of wirings which are parallel to one another and having one end to be connected to the input side wirings of the first flexible board and the other end to be connected to the relay board on a side opposite to the one end.

According to a fourth aspect of the present invention, there is provided a recording apparatus for performing recording on a recording medium in accordance with recording data, the recording apparatus comprising a recording head; a control unit which controls the recording apparatus; a driving circuit which receives a serial signal from the control unit to output a parallel signal to the recording head; a connector which is provided on the recording head or in the vicinity thereof and which is connected to an output wiring from the control unit; a first flexible cable on which the driving circuit is mounted, which has one end which is inputted with the serial signal to be supplied to the driving circuit, and which has the other end connected to the recording head to output the parallel signal from the driving circuit; and a second flexible cable which has one end connected to the one end of the first flexible cable and which has the other end connected to the connector. According to this recording apparatus, the expensive first flexible cable, on which the driving circuit is mounted, is allowed to have the length which is successfully shortened, and it is possible to lower the cost of the recording apparatus.

BRIEF DESCRIPTION OF THE DRAWINGS

FIG. 6 shows an exploded perspective view illustrating a recording head and a flexible wiring cable.

DESCRIPTION OF THE PREFERRED EMBODIMENTS

Figure 1:
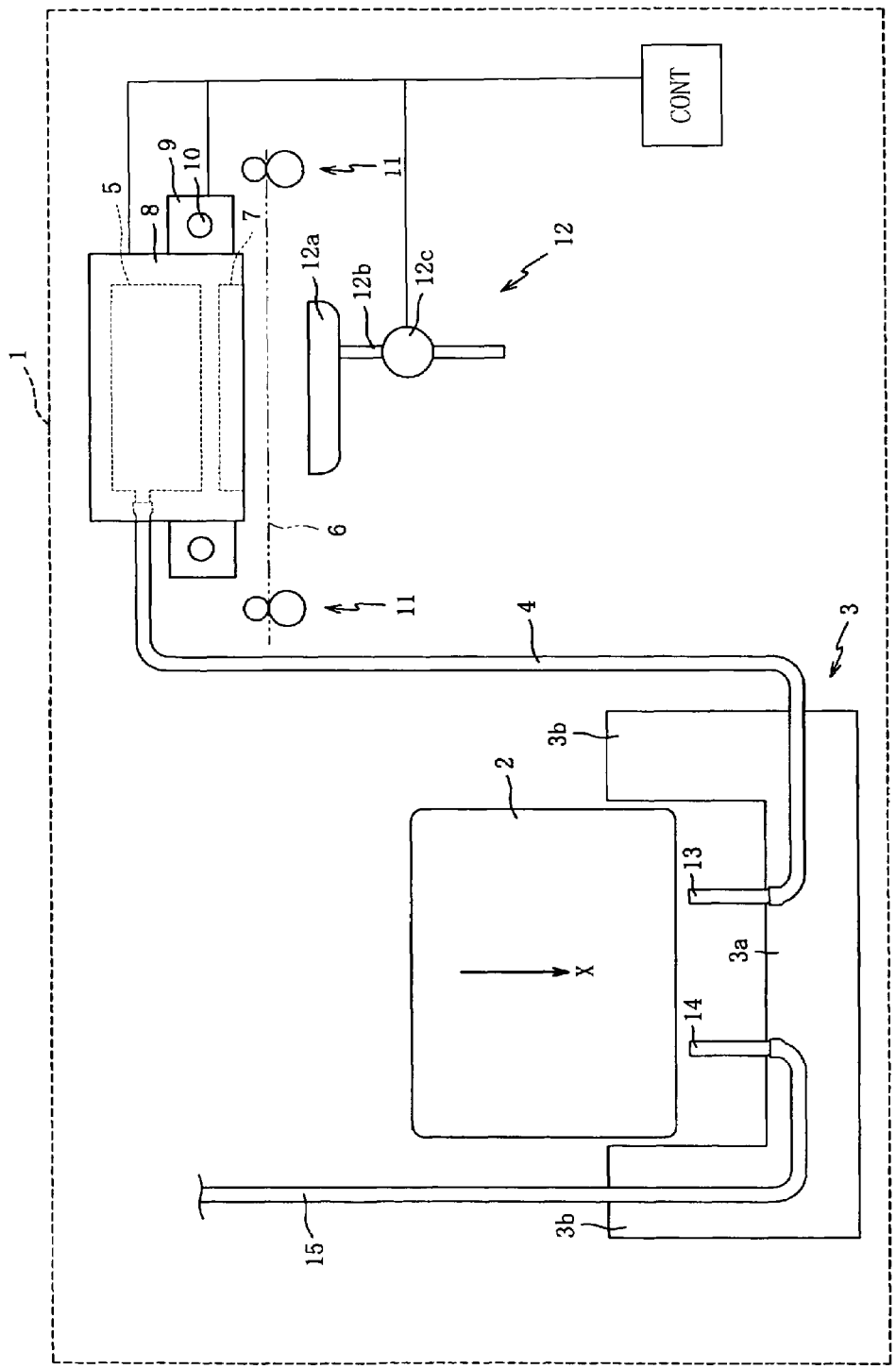
FIG. 1 schematically shows an ink-jet recording apparatus according to a first embodiment of the present invention.

Preferred embodiments of the present invention will be explained below with reference to the accompanying drawings. FIG. 1 schematically shows an ink-jet recording apparatus 1 according to a first embodiment of the present invention.

The ink-jet recording apparatus 1 has a mounting unit 3 to which an ink cartridge 2 is detachably mounted, an ink buffer tank 5 which stores the ink supplied from the ink cartridge 2 through an ink supply tube 4, a recording head 7 which discharges the ink stored in the ink buffer tank 5 toward recording paper 6, a carriage 9 which carries a recording head unit 8 provided with the ink buffer tank 5 and the recording head 7 and which reciprocates in the linear direction, a carriage shaft 10 which guides the reciprocating movement of the carriage 9, a transport mechanism 11 which transports the recording paper 6, a purge unit 12, and a control circuit (control unit or control means) CONT which controls the recording head 7, the cartridge 9, the transport mechanism 11 and the purge unit 12.

The ink cartridge 2 is provided for each of color inks of a plurality of colors including, for example, cyan, magenta, yellow, and black. The ink cartridge 2 is mounted to the ink-jet recording apparatus 1 to make it possible to perform the color printing. The ink cartridge 2 is mounted to the mounting unit 3 by forcibly pushing the ink cartridge 2 in the direction of the arrow X shown in FIG. 1.

The mounting unit 3 is provided with a base section 3a and guide sections 3b which are provided upstandingly on both sides of the base section 3a. A hollow ink-extracting tube 13 for extracting the ink stored in the ink cartridge 2 and a hollow outside air-introducing tube 14 for introducing the outside air into the ink cartridge 2 are arranged to protrude from the base section 3a which is interposed between the guide sections 3b.

The ink supply tube 4 is connected to one end of the ink-extracting tube 13. The ink-extracting tube 13 is communicated with the ink buffer tank 5 via the ink supply tube 4. An outside air-introducing tube 15 is connected to one end of the outside air-introducing tube 14. The outside air-introducing tube 14 is communicated with the outside air via the outside air-introducing tube 15.

The purge unit 12 is arranged outside of the recording range so that the purge unit 12 is opposed to the recording head 7. The purge unit 12 comprises a purge cap 12a which covers the surface of formation of nozzles 16y, 16m, 16k, 16c of the recording head 7 (see FIG. 5), a drain ink tube 12b which is communicated with the purge cap 12a, and a pump 12c which sucks the ink from the nozzles 16y, 16m, 16k, 16c via the drain ink tube 12b.

Figure 2:
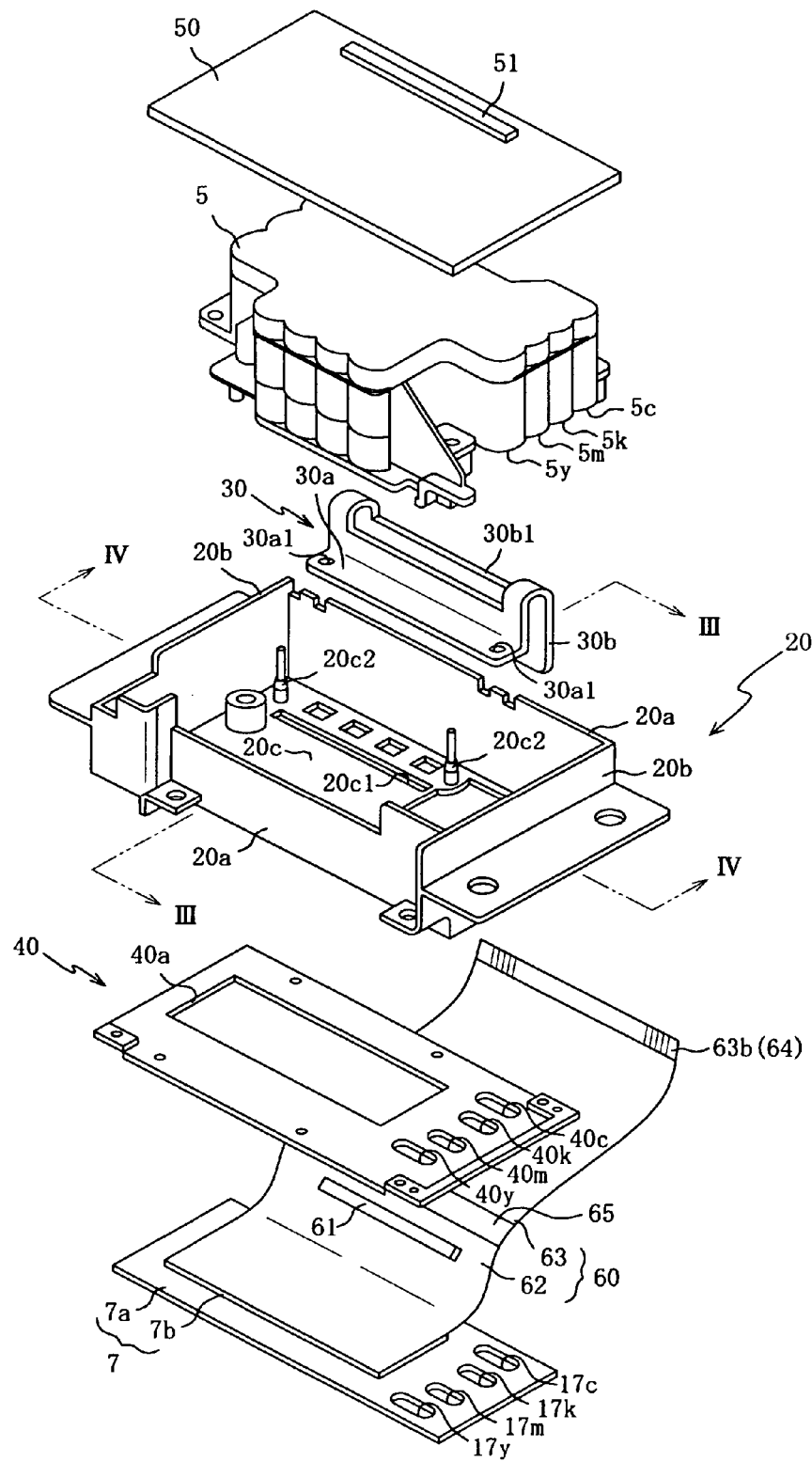
FIG. 2 shows an exploded perspective view illustrating a recording head unit.

Next, an explanation will be made with reference to FIGS. 2 to 5 about the structure of the recording head unit 8. FIG. 2 shows an exploded perspective view illustrating the recording head unit 8, FIGS. 3 and 4 show sectional views illustrating the recording head unit 8, and FIG. 5 shows a bottom view illustrating the recording head unit 8.

As described above, the recording head unit 8 is provided with the ink buffer tank 5 and the recording head 7. As shown in FIG. 2, the recording head unit 8 further includes a head holder 20 which is formed of a resin material to be substantially box-shaped, a heat sink 30 which is formed of a metal material (for example, aluminum) excellent in the heat-releasing performance, a reinforcing frame 40 which is formed to be substantially rectangular flat plate-shaped as viewed in a front view and which has an open exposure hole 40a, and a relay board 50 which is connected via a flexible cable (not shown) to a control circuit (see FIG. 1) stationarily placed on the main body side of the ink-jet recording apparatus 1.

As shown in FIG. 2, the head holder 20 includes a pair of side walls 20a and a pair of side walls 20b which are opposed to one another respectively, and a bottom wall 20c which vertically comparts (see FIGS. 3 and 4) the internal space of the head holder 20 formed by being surrounded by the respective side walls 20a, 20b. In the following description, the space, which is included in the internal space comparted by the bottom wall 20c and which is disposed over (upper side in FIG. 2) the bottom wall 20c, is referred to as "upper space", and the space, which is disposed under (lower side in FIG. 2) the bottom wall 20c, is referred to as "lower space".

Figure 3:
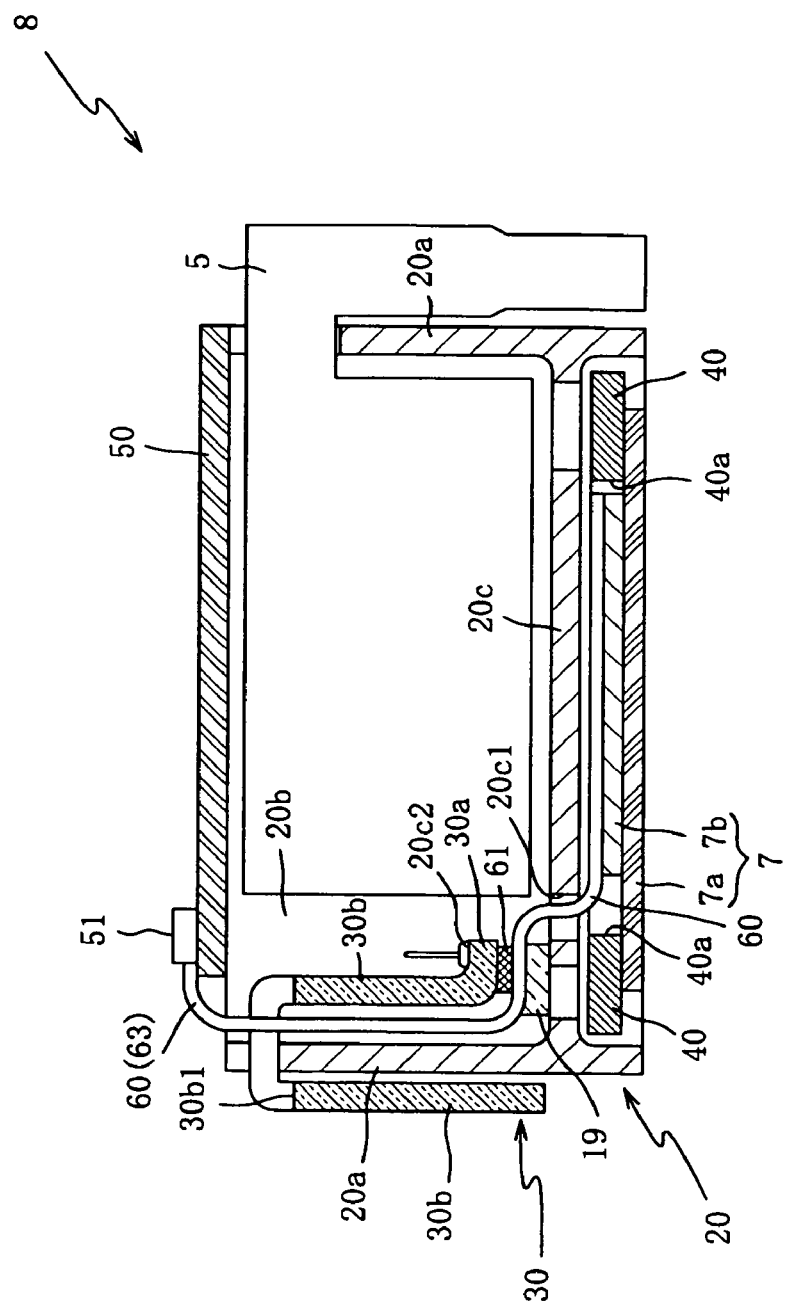
FIG. 3 shows a sectional view taken along a line III-III shown in FIG. 2.
Figure 4:
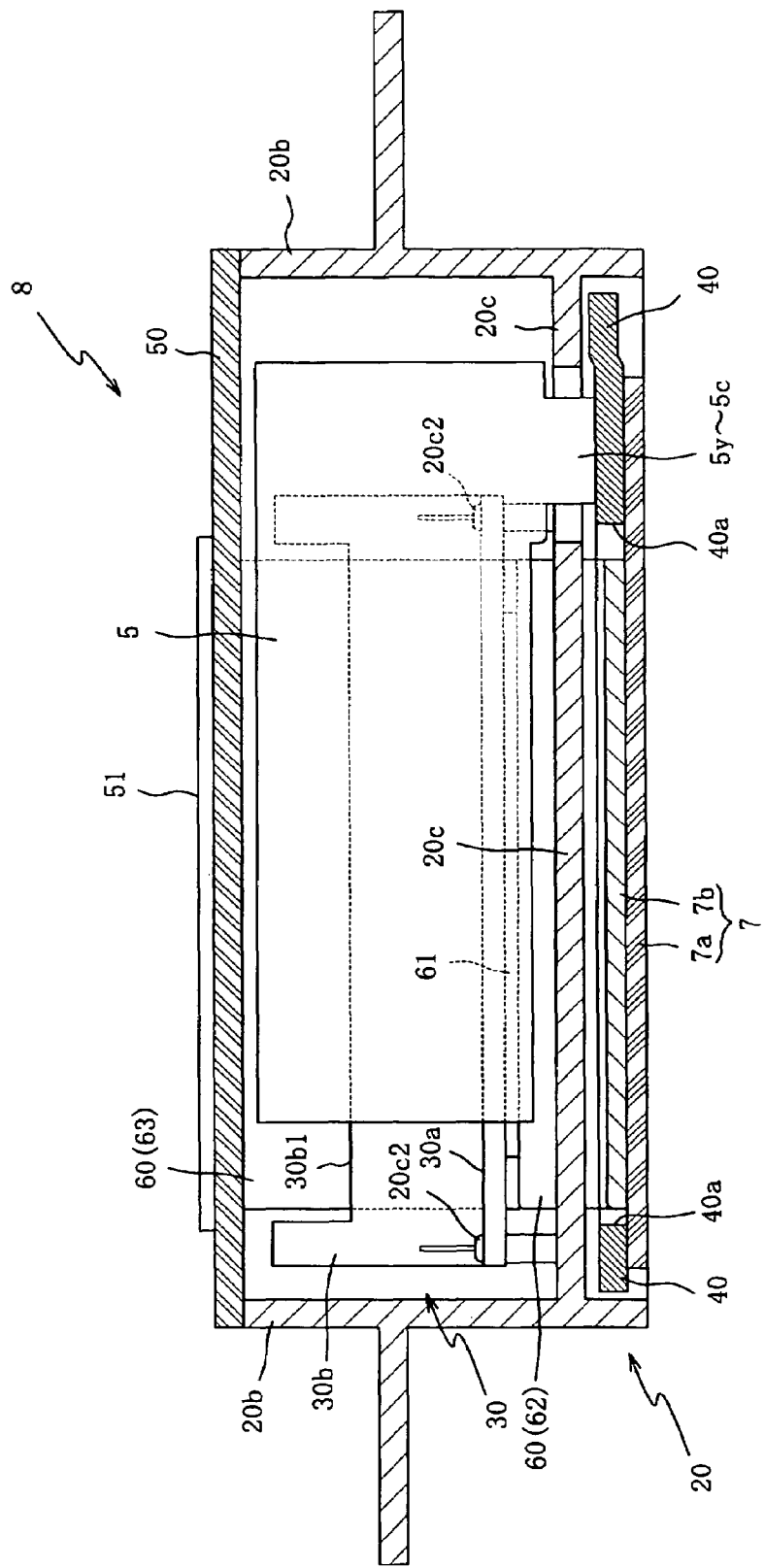
FIG. 4 shows a sectional view taken along a line IV-IV shown in FIG. 2.
Figure 5:
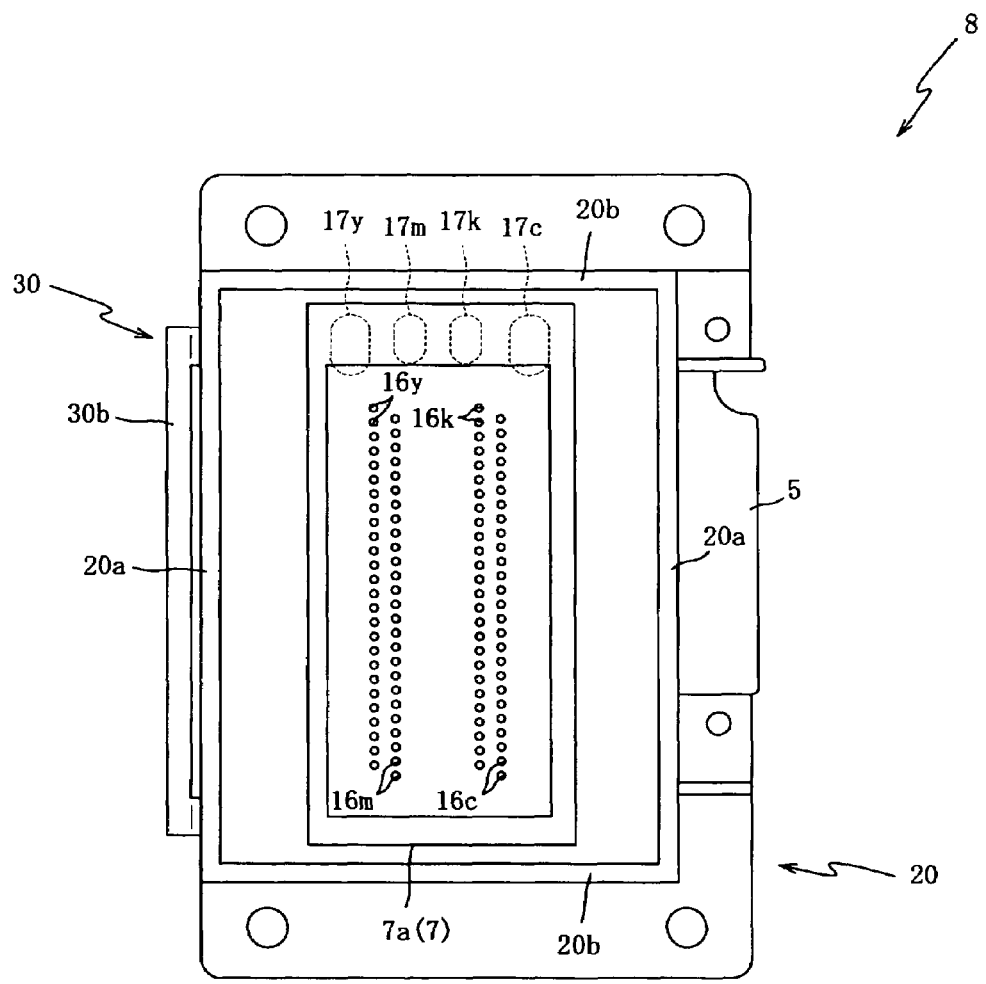
FIG. 5 shows a bottom view illustrating the recording head unit.

When the recording head unit 8 is assembled from the disassembled state shown in FIG. 2, then the recording head 7 is supported by the aid of the reinforcing frame 40 in the lower space (lower side in FIGS. 3 and 4) in the head holder 20 as shown in FIGS. 3 to 5, and the ink buffer tank 5 and the heat sink 30 are arranged in the upper space in the head holder 20. Further, the relay board 50 is supported on the upper surface side of the head holder 20 (FIGS. 3 and 4).

The reinforcing frame 40 is secured by an adhesive on the lower surface side (lower side in FIGS. 3 and 4) of the bottom wall 20c in the lower space in the head holder 20. The recording head 7 is secured on the lower surface side of the reinforcing frame 40. A piezoelectric actuator plate 7b of the recording head 7 is arranged to be exposed toward the bottom wall 20c from the exposure hole 40a which is open through the reinforcing frame 40 as described later on.

As shown in FIG. 5, nozzles 16y for the yellow ink, nozzles 16m for the magenta ink, nozzles 16k for the black ink, and nozzles 16c for the cyan ink are formed in arrays respectively on the surface of the recording head 7 on the lower surface side (side opposed to the recording paper 6 (see FIG. 1)). The direction (left and right directions as shown in FIG. 5), which is substantially perpendicular to the direction of the respective nozzle arrays, is the direction of movement of the carriage 9 (see FIG. 1).

The ink buffer tank 5 is constructed to have the interior which is comparted into an ink tank for the yellow ink, an ink tank for the magenta ink, an ink tank for the black ink, and an ink tank for the cyan ink (any one of the ink tanks is not shown). As shown in FIG. 2 or 4, tubes 5y, 5m, 5k, 5c are provided to extend to the recording head 7 on the lower surface side of the respective ink tanks (lower side in the sheet surface of FIG. 2 or 4). The respective tubes 5y, 5m, 5k, 5c are connected to ink supply ports 17y, 17m, 17k, 17c of the recording head 7 as described later on via ink supply passages 40y, 40m, 40k, 40c of the reinforcing frame 40.

An explanation will now be made with reference to FIG. 6 about the detailed structure of the recording head 7. FIG. 6 shows an exploded perspective view illustrating the recording head 7 and a flexible wiring cable 60. FIG. 6 is depicted while omitting a part of the flexible wiring cable 60.

The recording head 7 includes a cavity plate 7a which is formed by stacking a plurality of plates, and a plate-shaped piezoelectric actuator plate 7b. The cavity plate 7a has, on an upper surface, the ink supply ports 17y, 17m, 17k, 17c in the same manner as known one described in U.S. Pat. No. 6,679,595 B2 corresponding to Japanese Patent Application Laid-open No. 2002-240306. The inks are distributed to a plurality of pressure chambers via manifold flow passages extending from the respective ink supply ports 17y to 17c to arrive at the corresponding nozzles 16y, 16m, 16k, 16c from the respective pressure chambers.

The piezoelectric actuator plate 7b has a plurality of pressure-generating means, i.e., piezoelectric deforming sections corresponding to the respective pressure chambers, and has, on the upper surface thereof, electrodes 18y, 18m, 18k, 18c which are connected to the respective piezoelectric deforming sections. The number of the arranged electrodes 18y, 18m, 18k, 18c corresponds to the number of the nozzles 16y, 16m, 16k, 16c.

As shown in FIG. 6, the flexible wiring cable 60, which has the flexibility, is stacked on the upper surface (upper side of the sheet surface in FIG. 6) of the piezoelectric actuator plate 7b. A wiring pattern (not shown), which extends from an IC chip 61 mounted on the flexible wiring cable 60 and internally installed with a driving circuit, is connected to the respective electrodes 18y, 18m, 18k, 18c.

When the driving pulses are supplied from the IC chip 61 to the respective piezoelectric deforming sections of the piezoelectric actuator plate 7b, then the pressure is applied to the inks contained in the pressure chambers, and the inks can be discharged downwardly (in the downward direction in the sheet surface of FIG. 6) from the respective nozzles 16y, 16m, 16k, 16c.

As shown in FIG. 6, the flexible wiring cable 60 has the width in the array direction of the respective electrodes 18y, 18m, 18k, 18c, i.e., in the array direction of the nozzles 16y, 16m, 16k, 16c (see FIG. 5). The flexible wiring cable 60 extends in the direction substantially perpendicular to the direction of the nozzle arrays.

An explanation will be made while returning to FIGS. 2 to 5. As shown in FIG. 3, the flexible wiring cable 60 is arranged as follows. That is, the flexible wiring cable 60 passes through a communication passage 20c1 which is formed through the bottom wall 20c of the head holder 20, and enters the upper space from the lower space in the head holder 20. The flexible wiring cable 60 extends to the side wall 20a substantially in parallel to the bottom wall 20c in the upper space, and then extends upwardly (in the upward direction in the sheet surface of FIG. 3) over the head holder 20 substantially in parallel to the side wall 20a. A connector side terminal section 63b (see FIG. 7A), which is disposed at the tip of the flexible wiring cable 60 as described later on, is connected to a connector 51 of the relay board 50 composed of a rigid member arranged on the upper surface side (upper side in FIGS. 3 and 4) of the head holder 20.

As described above, the relay board 50 is arranged at the position located further upwardly (on the upper side in the sheet surface of FIG. 3) with respect to the ink buffer tank 5 arranged on the side opposite to the ink discharge side (lower side in the sheet surface of FIG. 3) of the recording head 7 as shown in FIG. 3. The connector 51 of the relay board 50 is mutually connected to the connector side terminal section 63b (see FIG. 7A) disposed at the tip of the flexible wiring cable 60 as described later on, on the side of the upper surface of the relay board 50 as the surface disposed on the side opposite to the ink discharge direction.

Therefore, it is possible to avoid beforehand the pollution with any excessive ink such as the ink mist at the connecting portion between the connector 51 and the connector side terminal section 63b (see FIG. 7A) as described later on. Further, it is possible to secure the operation space over (on the upper side in the sheet surface of FIG. 3) the connecting portion between the connector 51 and the connector side terminal section 63b. Thus, it is possible to improve the efficiency of the operation including, for example, the connecting operation and the repairing operation when any trouble occurs.

The relay board 50 is connected via the unillustrated flexible wiring member to the control circuit stationarily placed on the main body side of the recording apparatus. The heat sink 30 is provided to release, to the outside, the heat generated by the IC chip 16 mounted on the flexible wiring cable 60. As shown in FIGS. 2 to 4, the heat sink 30 includes a seat surface section 30a which is formed to have a flat surface, and a main body section 30b which is formed by being bent in a substantially U-shaped form as viewed in a side view. A through-hole 30b1 is formed penetratingly through the curved portion of the main body section 30b.

The heat sink 30 is attached in the upper space in the head holder 20 such that two attachment holes 30a1 (see FIG. 2), which are formed through the seat surface section 30a, are secured to attachment bosses 20c2 which are provided to protrude from the bottom wall 20c of the head holder 20.

As shown in FIG. 3, the main body section 30b of the heat sink 30 is arranged opposingly while being separated by predetermined spacing distances from the both front and back surfaces of the side wall 20a of the head holder 20. The flexible wiring cable 60 passes through the space between the opposing surfaces of the main body section 30a and the side wall 20a. The flexible wiring cable 60 is arranged to extend toward the relay board 50 from the through-hole 30a1 of the main body section 30b.

The state, in which the heat sink 30 is attached to the head holder 20, is shown in FIG. 3. In this state, the IC chip 61 is pressed to make contact with the seat surface 30a of the heat sink 30 so that the thermal conduction can be effected by the aid of a rubber-like elastic member 19 which is secured to the bottom wall 20c of the head holder 20.

Next, an explanation will now be made with reference to FIG. 7 about the detailed structure of the flexible wiring cable 60.

The flexible wiring cable 60 includes COF (chip on film) 62 as a first flexible board on which the IC chip 61 is mounted, and FFC (flexible flat cable) 63 as a second flexible board. COF 62 includes an input side wiring and an output side wiring which are connected to the input side and the output side of the IC chip 61 respectively, the input side wiring and the output side wiring being printed on an electric insulation film as known in the art. The ends of the output side wiring are connected to the electrodes 18k, 18y, 18c, 18m on the actuator plate 7 shown in FIG. 6 respectively.

The driving circuit, which is internally installed to the IC chip 61, is operated as follows. That is, the recording data, which is outputted in serial via the relay board 50 from the control circuit disposed on the side of the main body of the recording apparatus, is converted into the parallel signal corresponding to the number of the pressure-generating means of the recording head 7, the parallel signal being outputted as the voltage to drive the pressure-generating means.

Therefore, a number of wires, which is at least not less than the number of the nozzles 16*y*, 16*m*, 16*k*, 16*c* (see FIG. 5), is required for the output side wiring pattern of COF 62, and thus the wiring density is increased. On the other hand, it is enough for the input side wiring pattern of COF 62 (i.e., the wiring pattern of FFC 63) that the recording data signal line, the transfer clock signal line, and the latch signal line in addition to the signal lines such as the ground line, the driving power source line, and the signal power source line may be provided in amounts corresponding to serial/parallel converters provided for the respective ink colors. The input side wiring pattern of COF 62 can be constructed with an extremely small number of wires.

FFC 63 is a general purpose cable which is formed with a parallel wiring pattern 63P having a number of wirings corresponding to the number of input side wirings of COF 62. One terminal section 63*a* is connected to the end (input side terminal section 62*a*) of the input side wiring of COF 62, and the other terminal section 63*b* is connected to the relay board 50. Therefore, COF 62 is manufactured exclusively for the recording head 7, while the general purpose FFC 63 is constructed more cheaply. On this condition, as described above, the input side wiring of COF 62 is connected to the connector 51 via the general purpose FFC 63. Therefore, the amount of use of the more expensive COF 62 can be decreased by the amount of use of FFC 63. Correspondingly thereto, it is possible to reduce the product cost as the entire ink-jet recording apparatus 1.

Figure 7A:
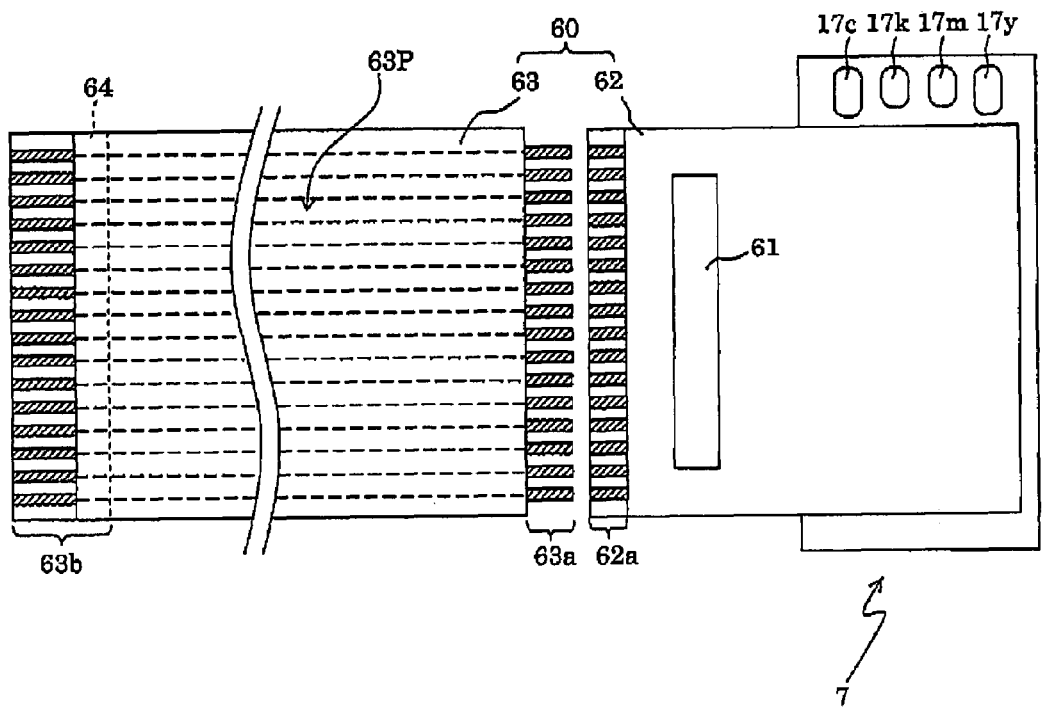
FIG. 7A shows a top view illustrating the flexible wiring cable.
Figure 7B:
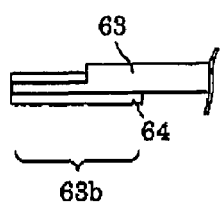
FIGS. 7B and 7C show side views illustrating terminal portions of the cable respectively.
Figure 7C:
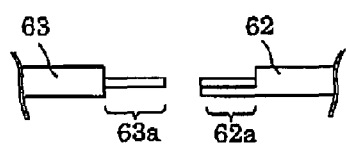

The connecting portion between FFC 63 and COF 62 is constructed as follows as shown in FIGS. 7A and 7C. That is, the input side terminal section 62*a* of COF 62 has one side surface of the wiring (upper side in the sheet surface of FIG. 7C) which is exposed in the surface direction of COF 62. On the other hand, as for the terminal section 63*a* of FFC 63 corresponding to the input side terminal section 62*a*, the electric insulation cover or coating is removed in the surface direction of FFC 63 on the both front and back surfaces (upper side and lower side of the sheet surface of FIG. 7C), and the wiring is exposed on the both front and back surfaces. Further, the wirings of the terminal sections 62*a*, 63*a* are arranged symmetrically with respect to a virtual line which passes through the center in the direction of arrangement of the wirings (vertical direction in FIG. 7A) and which extends in the longitudinal direction (horizontal direction in FIG. 7A) of FFC 63 and COF 62.

The both terminal sections 62*a*, 63*a* are connected to each other such that the exposed wirings of the terminal section 62*a* are overlapped to the corresponding wirings of the terminal section 63*a*, respectively, and are heated to melt the conductive brazing material (solder) formed on the surface of the wirings of one of the terminal sections 62*a* and 63*a*. Further, an electric insulation tape 65 (FIG. 6) is stuck to cover the side of the connecting portion on which the wirings are exposed.

As for the terminal section 63*b* of FFC 63 on the side of the relay board 50, the electric insulation cover or coating is removed in the surface direction of FFC on one side surface of the wiring (upper side in the sheet surface of FIG. 7B), and the wiring is exposed. A reinforcing plate 64 is added and affixed on the side (lower side in the sheet surface of FIG. 7B) opposite to the exposed side. The rigidity of the reinforcing plate 64 is higher than that of FFC 63. The reinforcing plate 64 is made of an electrical insulating film material having the rigidity such that the handling is easily performed upon the attachment/detachment with respect to the connector 51 as described later on. For example, the reinforcing plate 64 is thermally fused or adhered to FFC 63.

The relay board 50 has the wiring pattern which is printed and formed on an electrical insulating substrate having the rigidity. The relay board 50 has the connector 51 which is disposed on the upper surface thereof and to which the terminal section 63*b* of FFC 63 is detachably connected. Those of various types are used for the connector 51 including, for example, those of the type in which the terminal section 63*b* is detachably inserted and those of the type in which the terminal section 63*b* is held with a lever member.

As described above, in the ink-jet recording apparatus according to the first embodiment, the terminal sections 62*a*, 63*a*, which connect COF 62 and FFC 63, are arranged symmetrically with respect to the center in the widthwise direction, and the terminal section 63*a* of FFC 63 is exposed on the both front and back surfaces. Therefore, any one of the front and back of FFC 63 can be connected to COF 62. FFC 63 can be used for those of any type in which the connector 51 of the relay board 50 has the contact on any one of the upper and lower side as shown in FIG. 9 as described later on. It is possible to reduce the product cost as the entire ink-jet recording apparatus 1.

The both terminal sections 62*a*, 63*a* are connected by overlapping and soldering the exposed wirings. Therefore, for example, even when any short circuit is formed between the adjoining terminals or any open terminal is generated at the connecting portion, then FFC 63 and COF 62 can be disengaged from the connected state by melting the solder again at the connecting portion so that they can be reused. As a result, when the ink-jet recording apparatus 1 is produced, it is possible to improve the yield.

The terminal section 63*b* of FFC 63 is detachably connected to the connector 51 of the relay board 50. Therefore, if it is necessary to exchange the recording head 7, the IC chip 61, and/or the relay board 50, for example, due to any initial failure or trouble, it is possible to perform the exchange operation with ease.

Figure 8:
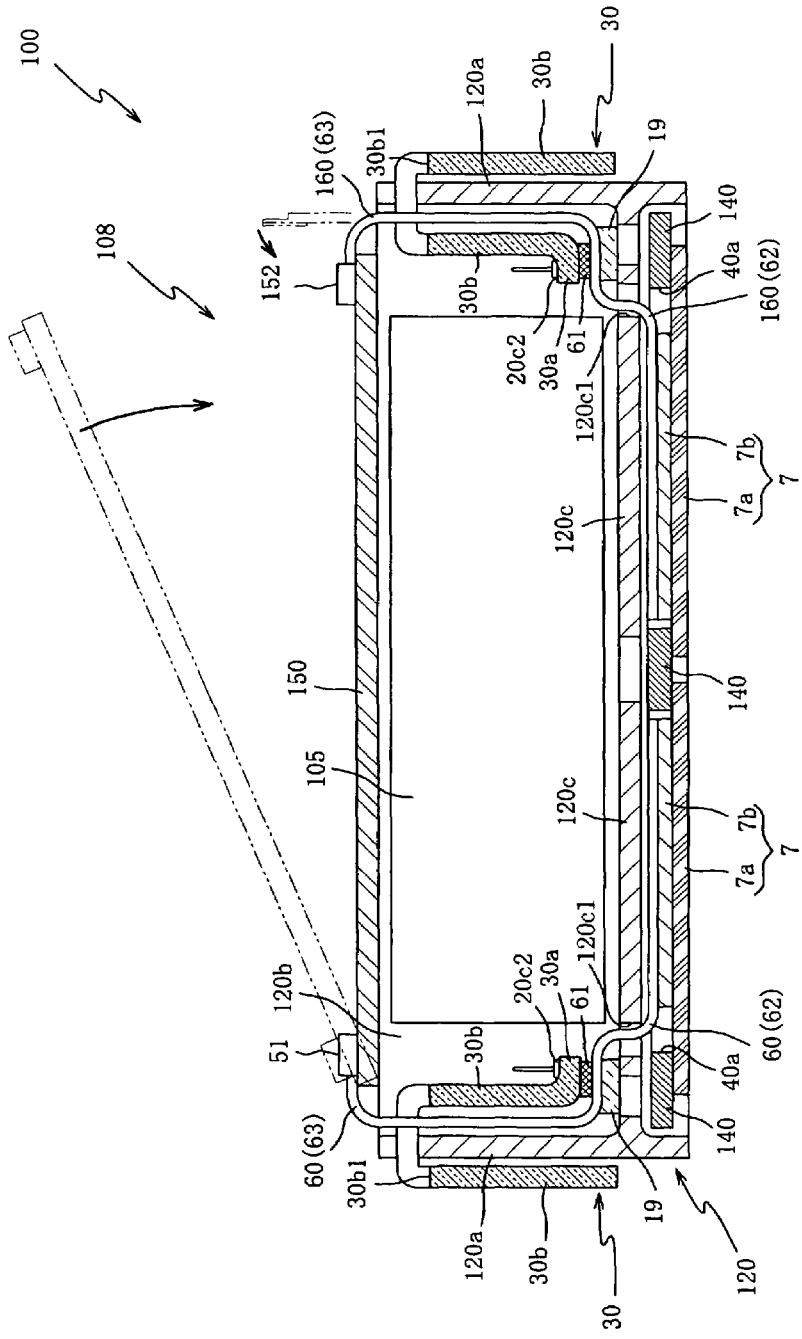
FIG. 8 shows a sectional view illustrating a recording head unit according to a second embodiment.

Next, a second embodiment will be explained with reference to FIG. 8. FIG. 8 shows a sectional view illustrating a recording head unit 108.

In the case of the ink-jet recording apparatus 1 of the first embodiment, the head unit 8 is provided with only one recording head 7. On the other hand, in the case of an ink-jet recording apparatus 100 of the second embodiment, the head unit 108 is provided with two recording heads 7. The same portions as those of the first embodiment described above are designated by the same reference numerals, any explanation of which will be omitted.

A head holder 120 has the internal space which is formed by pairs of mutually opposing side walls 120*a* and side walls 120*b* in the same manner as in the first embodiment. The internal space is comparted by a bottom wall 120*c* into the lower space and the upper space. As shown in FIG. 8, the two recording heads 7 are arranged left-right symmetrically while being supported by a reinforcing frame 140 in the lower space. An ink buffer tank 105 and heat sinks 30 are arranged in the upper space. A relay board 150 is supported on the upper surface side (upper side in the sheet surface of FIG. 8) of the head holder 120.

Each of the recording heads 7 is constructed in the same manner as that described in the first embodiment. As described above, the two recording heads 7 are supported in the lower space in the head holder 120. The both recording heads 7 are arranged and aligned in the direction (horizontal direction in the sheet surface of FIG. 8) substantially perpendicular to the nozzle array direction (direction perpendicular to the sheet surface of FIG. 8) so that the two nozzle arrays as shown in FIG. 5 are used for each of the ink colors, and the nozzle arrays of the both recording heads are substantially in parallel to one another.

The ink buffer tank 105 is comparted into an ink tank for the yellow ink, an ink tank for the magenta ink, an ink tank for the black ink, and an ink tank for the cyan ink (any one of them is not shown) corresponding to the nozzle arrays of each of the ink colors. The respective tanks are connected to two ink supply ports 17c, 17k, 17m and 17y of the recording heads 7 respectively (see FIG. 2).

Flexible wiring cables 60, 160 are arranged to extend in the mutually opposite directions from the respective recording heads 7 and in the directions (horizontal direction in FIG. 8) substantially perpendicular to the nozzle array direction. Each of the flexible wiring cables 60, 160 passes through a communication passage 120c1 which is formed through a bottom wall 120c in the same manner as in the first embodiment, and enters the upper space disposed in the head holder 120. Each of the flexible wiring cables 60, 160 extends upwardly substantially in parallel to the side wall 120a, and is connected to each of connectors 51, 152, respectively, provided at both of the opposing side edges of the relay board 150.

Each of the flexible wiring cables 60, 160 comprises COF 62 which is connected to the side of the recording head 7, and FFC 63 which connects COF to the relay board 50 in the same manner as explained in the first embodiment. COF 62 and FFC 63 are both constructed to have the same length. When the nozzle arrangements of the two recording heads 7 are in the point symmetry with respect to the central point between the both recording heads, then the arrangements of the electrodes 18y to 18c of the piezoelectric actuator plates are also in the point symmetry, and common COF 62 can be used for both of the recording heads 7. Irrelevant to the common use of both COF's 62, the same FFC 63 can be commonly used for both COF's 62 by making the wiring pitches of the input side terminal sections 62a to be identical. However, in relation to the two flexible wiring cables 60, 160 with respect to the respective COF's 62, the FFC's 63 of the two flexible wiring cables 60, 160 are joined to the corresponding COF's 62 by overlapping the terminal sections 63a with the terminal section 62a, respectively, such that one of the FFC's 63 is joined to the corresponding COF 62 with the front and back of the terminal section 63a thereof being reversed with respect to the terminal section 63a of the other of FFC's 63, so that the terminal sections 63b having the reinforcing plates 64 are matched to the directions in which the contacts of the corresponding connectors 51, 151 are arranged as described later on.

Figure 9A:
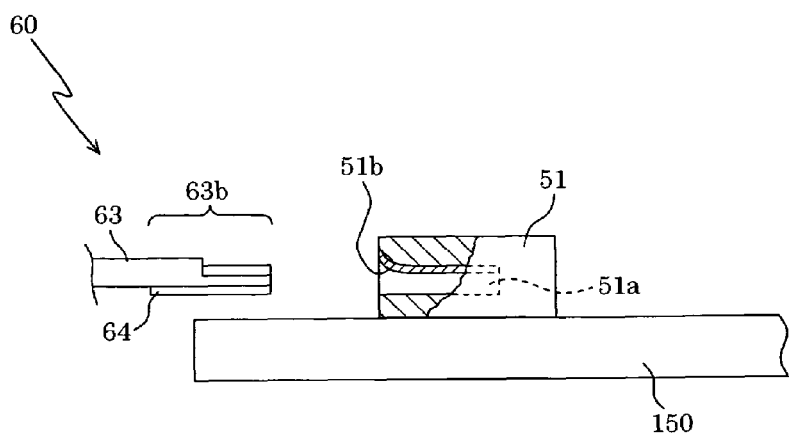
FIGS. 9A and 9B show side views illustrating, in cross sections, parts of connectors.
Figure 9B:
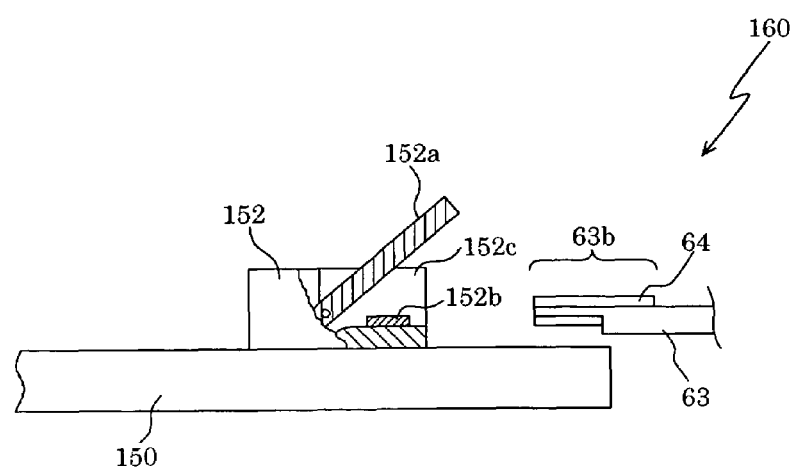

An explanation will now be made with reference to FIG. 9 (FIGS. 9A and 9B) about the detailed structures of the connectors 51, 152 of the relay board 150. FIG. 9A shows a side view of the connector 51, and FIG. 9B shows a side view of the connector 152. As shown in FIG. 9A, the connector 51 includes a retaining recess 51a which insertably retains the connector side terminal section 63b, and a contact 51b which is electrically connected to the terminal section 63b inserted into the retaining recess 51a.

On the other hand, as shown in FIG. 9B, the connector 152 includes a lever member 152a which is swingably operable, and a contact 152b which is electrically connected to the terminal section 63b. The connector 152 is constructed as follows. That is, when the lever member 152a is swingably moved upwardly (in the upward direction in the sheet surface of FIG. 9B), a receiving section 152c, which is disposed over the upper surface of the contact 152b, can be opened or released. Further, when the lever member 152a is depressed downwardly (in the downward direction in the sheet surface of FIG. 9B), the terminal section 63b, which has been received by the receiving section 152c, can be held between the lever member 152a and the contact 152b while being electrically connected to the contact 152b.

When the two flexible wiring cables 60, 160 as described above are connected to the relay board 150, then one connector 51 of the relay board is firstly approached the terminal section 63b of the flexible wiring cable 60 as shown by two-dot chain lines in FIG. 8, and the terminal section 63b is inserted into the recess 51a of the connector 51 to effect the electric connection. After that, the other connector 152 is approached the tip of the other flexible wiring cable 160, and the relay board 150 is installed at an approximately fixed position with respect to the head holder 120. In this state, the tip of the flexible wiring cable 160 is bent and inserted into the released receiving section 152c, and the terminal section 63b is laid on the contact 152b to be held between the lever member 152a and the contact 152b.

If only the inserting/pulling type connectors 51 are used for the connectors on the both sides of the relay board 150, it is necessary to secure any space on at least one side of the relay board 150 in order to insert/pull out the terminal section 63b. Further, it is also necessary that the flexible wiring cable has a length with a certain margin. However, when the arrangement as described above is adopted, it is unnecessary to provide any unnecessary margin for the length of the flexible wiring cable. It is possible to miniaturize the recording head unit 8 corresponding thereto.

As shown in FIG. 9A, the contact 51b of connector 51, which is one connector of the connectors, is provided so that the contact 51b is directed downwardly (in the downward direction in the sheet surface of FIG. 9A) on the upper side surface of the retaining recess 51a. Therefore, FFC 63 of the flexible wiring cable 60 (see FIG. 7) is connected to COF 62 so that the wiring pattern of the connector side terminal section 63b is directed upwardly (in the upward direction in the sheet surface of FIG. 9A) in the assembled state of the recording head unit 108 (see FIG. 8).

As shown in FIG. 9B, the contact 152b of the connector 152, which is the other connector of the connectors, is provided while being directed upwardly (in the upward direction in the sheet surface of FIG. 9B) so that the contact 152b is opposed to the lever member 152a. Therefore, FFC 63 of the flexible wiring cable 160 (see FIG. 7) is connected to COF 62 (see FIG. 7) so that the wiring pattern of the connector side terminal section 63b is directed downwardly (in the downward direction in the sheet surface of FIG. 9B) in the assembled state of the recording head unit 108 (see FIG. 8).

That is, the same FFC 63 is used for both of the flexible wiring cables 60, 160 as described above. However, one FFC 63 is connected to COF 62 in the state in which the front and the back are directed in the opposite directions with respect to the other FFC 63 in order to reverse the direction in which the contact of the connector side terminal section 63b thereof contacts the contact of the corresponding connector.

As described above, the two connectors 51, 151 are different in the direction in which respective contacts are arranged. Therefore, even when the two types of the flexible wiring cables 60, 160, which are different in the direction in which the contact of the connector side terminal section 63b contacts the corresponding connector, are required, FFC 63 and COF 62 can be commonly used for the two types of the flexible wiring cables 60, 160 by reversing FFC 63. Therefore, it is possible to unify the parts, and it is possible to reduce the product cost as the entire ink-jet recording apparatus 100 corresponding thereto.

The present invention has been explained above on the basis of the embodiments. However, the present invention is not limited to the embodiments described above at all. It is easily presumed that various improvements and modifications can be made within a range without deviating from the gist or essential characteristics of the present invention. For example, the connector is provided on the relay board which is supported by the head holder. However, the connector may be provided at a place other than the above. For example, the connector may be attached directly to the head holder. Alternatively, the connector may be attached to various members disposed in the vicinity of the recording head. In this arrangement, it is also allowable that the relay board is not provided.

What is claimed is:

1. A recording apparatus comprising:
    a recording means which performs recording on a recording medium;
    a driving circuit which drives the recording means;
    a control means which controls the recording apparatus;
    a relay board which relays recording data outputted from the control means to the driving circuit; and
    a connecting means which electrically connects the recording means, the driving circuit, and the relay board, wherein the connecting means includes:
    a first flexible board on which the driving circuit is mounted and which is formed with output side wirings of the driving circuit to be connected to the recording means and input side wirings of the driving circuit; and
    a second flexible board which is formed with a pattern of wirings which are parallel to one another having one end to be connected to the input side wirings of the first flexible board and the other end to be connected to the relay board on a side opposite to the one end.

2. The recording apparatus according to claim 1, wherein the second flexible board has a reinforcing plate which is added to the other end to be connected to the relay board, and the other end is detachably connected to a connector device provided for the relay board.

3. The recording apparatus according to claim 1, wherein:
    the input side wirings of the first flexible board and the wirings of the second flexible board are formed symmetrically with respect to a center in an arrangement direction of the wirings of the first and second flexible boards at connecting side ends thereof;
    a connecting side end of the input side wirings of the first flexible board to be connected to the second flexible board is exposed in a surface direction of the first flexible board;
    a connecting side end of the wirings of the second flexible board to be connected to the first flexible board is exposed in a surface direction on both front and back surfaces of the second flexible board; and
    the exposed connecting side end of the input side wirings and the exposed connecting side end of the wirings are overlapped and connected to one another.

4. The recording apparatus according to claim 1, wherein the relay board is arranged by a spacing distance to the recording means, and the second flexible board is connected to a surface of the relay board disposed on a side opposite to a side of the recording means.

5. The recording apparatus according to claim 4, wherein:
    the recording means is an ink-jet head comprising a plurality of nozzles which discharge an ink, and pressure-generating means which selectively applies discharge pressures to the ink contained in each of the nozzles and further comprising an ink tank which supplies the ink to each of the nozzles;
    the ink tank is arranged over the pressure-generating means disposed on a side opposite to an ink discharge side, and the relay board is arranged over the ink tank; and
    the second flexible board and the relay board are connected to each other on a side of an upper surface of the relay board as a surface disposed on a side opposite to the ink tank.

6. The recording apparatus according to claim 4, wherein:
    the recording means has two groups of nozzle arrays, and the first flexible board on which the driving circuit is mounted and the second flexible board which is connected to the first flexible board are provided for each of the groups;
    the second flexible boards of the respective groups are connected to two connector devices provided along both opposing side edges of the relay board respectively;
    one of the two connector devices is constructed to be retainable of a tip of the wirings of the other end side of the second flexible board in a state of being electrically connected to the wirings of the second flexible board, and to be detachably insertable of the tip of the wirings of other end side; and
    the other of the two connector devices is constructed such that a lever member which is swingably operated is provided, a receiving section is opened when the lever member is swingably operated in one direction, and a tip of the wirings of the other end side, which has been received in the receiving section, is retainable in a state in which the tip of the wirings of the other end side is electrically connected when the lever member is swingably operated in a different direction from the one direction.

7. The recording apparatus according to claim 1, wherein the first flexible board has a length which is designed to be shorter than a length of the second flexible board.

8. The recording apparatus according to claim 1, wherein the driving circuit converts recording data outputted in serial from the control means into a parallel signal corresponding to the recording means, the parallel signal being outputted as a voltage for driving the recording means.

9. A recording apparatus comprising a plurality of recording means which perform recording on a recording medium, a control means which controls the recording apparatus, a relay board which relays recording data outputted from the control means to the recording means, and a plurality of connecting means which electrically connect the recording means to the relay board, wherein each of the connecting means includes:
    a first flexible board which is formed with a pattern of wirings having an output side end corresponding to an associated recording means of the plurality of recording means to be connected thereto and an input side end; and
    a second flexible board which is formed with a pattern of wirings which are parallel to one another having one end to be connected to the input side end of the first flexible board and the other end to be connected to the relay board on a side thereof opposite to the one end, and wherein:
    the input side end of the first flexible board and the one end of the second flexible board connected thereto are formed symmetrically with respect to a center in an arrangement direction of the input side end and the one end, the input side end of the first flexible board is exposed in a surface direction of the first flexible board, the one end of the second flexible board to be connected to the first flexible board is exposed in a surface direction on both front and back surfaces of the second flexible board, and the exposed input side end and the exposed one end are overlapped and connected to each other;

the second flexible board has a reinforcing plate which is added to one surface of the other end to be connected to the relay board; and the relay board has a plurality of connectors which are provided along side edges opposing to each other, a connector of the connectors, which is provided along one of the side edges, is constructed so that the other end of the second flexible board to be connected to the relay board is detachably insertable, a connector of the connectors, which is provided along the other of the side edges, is constructed so that the other end of the second flexible board to be connected to the relay board is retainable with a swingable lever member, and the connector provided along the one of the side edges and the connector provided along the other of the side edges have contacts to make contact with the ends of the second flexible boards, the contacts being disposed on mutually opposite sides with respect to the surface of the flexible board.

10. The recording apparatus according to claim 9, wherein a driving circuit, which drives the recording means, is mounted on the first flexible board.

11. The recording apparatus according to claim 9, wherein:

the recording means is an ink-jet head comprising a plurality of nozzles which discharge an ink, and pressure-generating means which selectively applies discharge pressures to the ink contained in each of the nozzles and further comprising an ink tank which supplies the ink to each of the nozzles; and the relay board is arranged on a side opposite to the ink-jet head with the ink tank intervening therebetween.

12. The recording apparatus according to claim 9, wherein the driving circuit converts recording data outputted in serial from the control means into a parallel signal corresponding to the plurality of recording means, the parallel signal being outputted as a voltage for driving the recording means.

13. A recording apparatus comprising:

a recording head which performs recording on a recording medium;

a driving circuit which drives the recording head;

a control unit which controls the recording apparatus;

a relay board which relays recording data outputted from the control unit to the driving circuit; and a connecting wiring which electrically connects the recording head, the driving circuit, and the relay board, wherein the connecting wiring includes:

a first flexible board on which the driving circuit is mounted and which is formed with output side wirings of the driving circuit to be connected to the recording head and input side wirings of the driving circuit; and a second flexible board which is formed with a pattern of wirings which are parallel to one another and having one end to be connected to the input side wirings of the first flexible board and the other end to be connected to the relay board on a side opposite to the one end.

14. A recording apparatus for performing recording on a recording medium in accordance with recording data, the recording apparatus comprising:

a recording head;

a control unit which controls the recording apparatus;

a driving circuit which receives a serial signal from the control unit to output a parallel signal to the recording head;

a connector which is provided on the recording head or in the vicinity thereof and which is connected to an output wiring from the control unit;

a first flexible cable on which the driving circuit is mounted, which has one end which is inputted with the serial signal to be supplied to the driving circuit, and which has the other end connected to the recording head to output the parallel signal from the driving circuit; and a second flexible cable which has one end connected to the one end of the first flexible cable and which has the other end connected to the connector.

15. The recording apparatus according to claim 14, wherein the one end and the other end of the first flexible cable are different in wiring density.

16. The recording apparatus according to claim 15, wherein a wiring density of the first flexible cable at the other end is higher than a wiring density at the one end, the wiring density at the one end being identical to a wiring density of the second flexible cable.

17. The recording apparatus according to claim 14, wherein the recording head is an ink-jet head which has a jetting surface formed with a plurality of nozzle arrays.

18. The recording apparatus according to claim 17, further comprising a circuit board which is provided on a surface on a side opposite to the jetting surface of the recording head, wherein the connector is provided on the circuit board.

19. The recording apparatus according to claim 14, wherein the first flexible cable and the second flexible cable are flat cables, one of which has a surface of a conducting section being exposed at one end thereof, and the other of which has both surfaces of a conducting section being exposed at the other end thereof.

20. The recording apparatus according to claim 14, wherein the recording head includes a plurality of heads, and each of the heads has the driving circuit, the connector, the first flexible cable, and the second flexible cable.

* * * * *